United States Patent
Fan et al.

(10) Patent No.: US 10,978,664 B2
(45) Date of Patent: Apr. 13, 2021

(54) DISPLAY SUBSTRATE AND METHOD FOR MANUFACTURING THE SAME AND DISPLAY DEVICE

(71) Applicant: BOE Technology Group Co., Ltd., Beijing (CN)

(72) Inventors: Yan Fan, Beijing (CN); Xing Fan, Beijing (CN); Hao Gao, Beijing (CN); Xiangmin Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/409,369

(22) Filed: May 10, 2019

(65) Prior Publication Data
US 2020/0168835 A1  May 28, 2020

(30) Foreign Application Priority Data

Nov. 22, 2018 (CN) .......................... 201811396525.6

(51) Int. Cl.
*H01L 51/52* (2006.01)
*H01L 51/56* (2006.01)

(52) U.S. Cl.
CPC ...... *H01L 51/5228* (2013.01); *H01L 51/5234* (2013.01); *H01L 51/56* (2013.01); *H01L 2251/308* (2013.01); *H01L 2251/558* (2013.01)

(58) Field of Classification Search
CPC .. H01L 51/5228; H01L 51/5234; H01L 51/56
See application file for complete search history.

(56) References Cited

U.S. PATENT DOCUMENTS

| | | | |
|---|---|---|---|
| 9,040,963 B2 * | 5/2015 | Lee | H01L 51/5044 136/257 |
| 9,692,016 B2 * | 6/2017 | Wehlus | H01L 51/447 |
| 10,205,121 B2 | 2/2019 | Song et al. | |
| 10,411,189 B2 * | 9/2019 | Kong | H01L 51/0023 |
| 10,615,231 B2 | 4/2020 | Wu et al. | |
| 2015/0008458 A1 | 1/2015 | Yamazaki et al. | |
| 2015/0243713 A1 | 8/2015 | Fujimura et al. | |
| 2015/0349291 A1 | 12/2015 | Song et al. | |

(Continued)

FOREIGN PATENT DOCUMENTS

| | | |
|---|---|---|
| CN | 104022139 A | 9/2014 |
| CN | 106953026 A | 7/2017 |

(Continued)

OTHER PUBLICATIONS

First Office Action, including Search Report, for Chinese Patent Application No. 201811396525.6, dated May 29, 2020, 18 pages.

*Primary Examiner* — William Coleman
(74) *Attorney, Agent, or Firm* — Westman, Champlin & Koehler, P.A.

(57) ABSTRACT

A display panel and a method for manufacturing the same and a display device are disclosed. The display substrate includes: a base substrate having a plurality of pixel areas, at least one of the plurality of pixel areas including a first electrode layer, an organic functional layer and a second electrode layer stacked in sequence on the base substrate; and a third electrode layer on a side of the second electrode layer facing away from the base substrate; wherein the third electrode layer is electrically connected to the second electrode layer.

19 Claims, 6 Drawing Sheets

(56) References Cited

U.S. PATENT DOCUMENTS

| | | | |
|---|---|---|---|
| 2017/0110530 A1* | 4/2017 | Lee | H01L 27/3248 |
| 2017/0117500 A1* | 4/2017 | Gunji | H01L 51/5231 |
| 2019/0058024 A1* | 2/2019 | Zeng | H01L 27/1214 |
| 2019/0088728 A1 | 3/2019 | Wu et al. | |
| 2019/0386241 A1* | 12/2019 | Yu | H01L 51/5237 |
| 2020/0044183 A1 | 2/2020 | Jiang et al. | |

FOREIGN PATENT DOCUMENTS

| | | |
|---|---|---|
| CN | 107611280 A | 1/2018 |
| CN | 108807497 A | 11/2018 |

\* cited by examiner

DISPLAY SUBSTRATE AND METHOD FOR MANUFACTURING THE SAME AND DISPLAY DEVICE

CROSS-REFERENCE TO RELATED APPLICATION

This application claims the benefit of Chinese Patent Application No. 201811396525.6 filed on Nov. 22, 2018 with the China National Intellectual Property Administration, the disclosure of which is incorporated herein in entirety by reference.

TECHNICAL FIELD

The present disclosure relates to the field of display technologies, and more particularly to a display substrate, a method for manufacturing the display substrate and a display device.

BACKGROUND

A display substrate in an organic light emitting diode (OLED) display panel includes an array of thin film transistors and an array of light emitting elements. The array of thin film transistors includes a plurality of thin film transistors. The array of light emitting elements includes an anode layer, a cathode layer and an organic functional layer between the anode layer and the cathode layer. The anode layer includes a plurality of anodes that are connected in one-to-one correspondence with drain electrodes of the thin film transistors.

The cathode layer is formed typically by sputtering transparent metal oxide such as indium tin oxide (ITO) or evaporating a partially transparent metal material over the organic functional layer.

SUMMARY

Embodiments of the present disclosure provide a display substrate comprising: a base substrate on which a plurality of pixel areas are arranged, at least one of the plurality of pixel areas comprising a first electrode layer, an organic functional layer and a second electrode layer stacked in sequence on the base substrate; and a third electrode layer on a side of the second electrode layer facing away from the base substrate; wherein the third electrode layer is electrically connected to the second electrode layer.

In some embodiments, the display substrate further comprises a transparent dielectric layer between the second electrode layer and the third electrode layer.

In some embodiments, the third electrode layer is a transparent electrode layer and the second electrode layer is a partially transparent metal electrode layer.

In some embodiments, an orthographic projection of the transparent dielectric layer on the base substrate covers orthographic projections of the plurality of pixel areas on the base substrate.

In some embodiments, the transparent dielectric layer comprises a plurality of dielectric areas, and an orthographic projection of each of the plurality of dielectric areas on the base substrate covers an orthographic projection of one of the plurality of pixel areas on the base substrate and the third electrode layer is electrically conducted to the second electrode layer through gaps between adjacent ones of the plurality of dielectric areas.

In some embodiments, the transparent dielectric layer is made from an organic insulating material or an inorganic insulating material.

In some embodiments, the transparent dielectric layer has a refractive index of 1.0 to 2.5.

In some embodiments, the transparent dielectric layer has a thickness of 30 nanometers to 300 nanometers.

In some embodiments, the material of the third electrode layer comprises an indium tin oxide, an indium zinc oxide or both of them.

Embodiments of the present disclosure also provide a display device comprising the display substrate as described above.

In some embodiments, the display substrate further comprises a transparent dielectric layer between the second electrode layer and the third electrode layer.

In some embodiments, the third electrode layer is a transparent electrode layer and the second electrode layer is a partially transparent metal electrode layer.

In some embodiments, an orthographic projection of the transparent dielectric layer on the base substrate covers orthographic projections of the plurality of pixel areas on the base substrate.

In some embodiments, the transparent dielectric layer comprises a plurality of dielectric areas, and an orthographic projection of each of the plurality of dielectric areas on the base substrate covers an orthographic projection of one of the plurality of pixel areas on the base substrate and the third electrode layer is electrically conducted to the second electrode layer through gaps between adjacent ones of the plurality of dielectric areas.

In some embodiments, the transparent dielectric layer is made from an organic insulating material or an inorganic insulating material.

In some embodiments, the transparent dielectric layer has a refractive index of 1.0 to 2.5.

In some embodiments, the transparent dielectric layer has a thickness of 30 nanometers to 300 nanometers.

Embodiments of the present disclosure also provide a method for manufacturing a display substrate, the method comprising: forming a first electrode layer, an organic functional layer and a second electrode layer sequentially in pixel areas on a base substrate; and forming a third electrode layer on a side of the second electrode layer facing away from the base substrate, the third electrode layer being electrically connected to the second electrode layer.

In some embodiments, after forming the second electrode layer and before forming the third electrode layer, the method further comprises: forming a transparent dielectric layer on a side of the second electrode layer facing away from the base substrate.

In some embodiments, the forming a transparent dielectric layer on a side of the second electrode layer facing away from the base substrate further comprises: patterning the transparent dielectric layer to form a plurality of dielectric areas, an orthographic projection of each of the plurality of dielectric areas on the base substrate covering an orthographic projection of one of the plurality of pixel areas on the base substrate, wherein the third electrode layer is electrically conducted to the second electrode layer through gaps between adjacent ones of the plurality of dielectric areas.

DETAILED DESCRIPTION OF EMBODIMENTS

Figure 1:
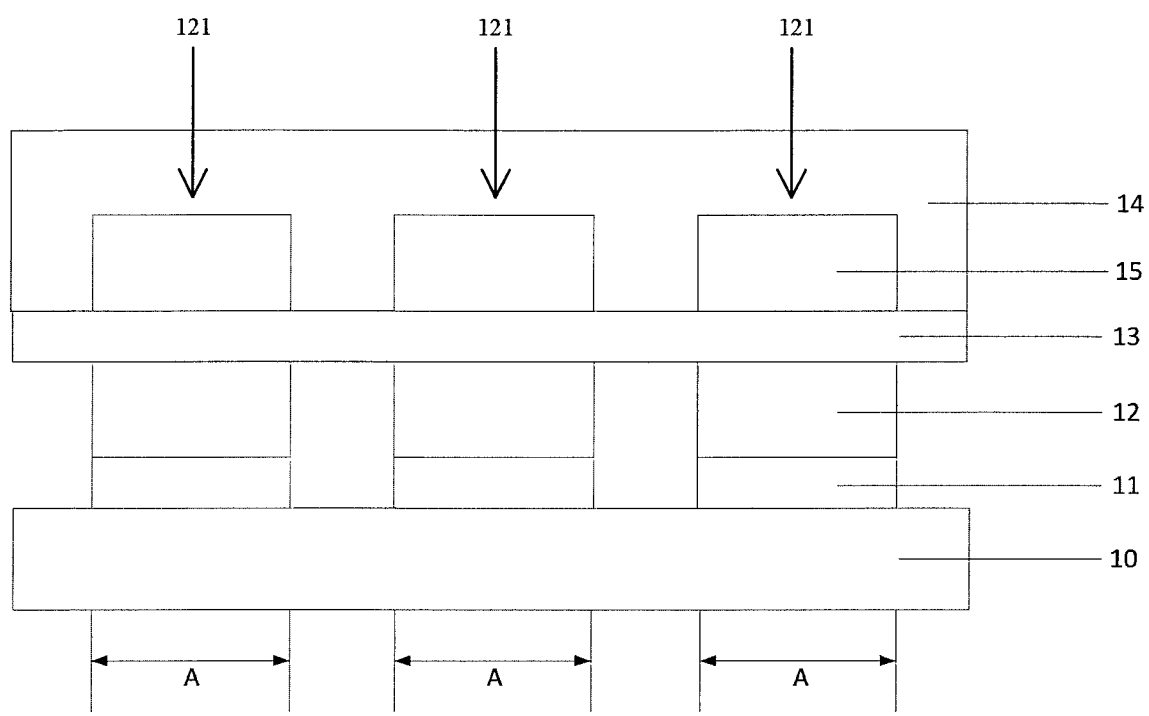
FIG. 1 is a schematic cross sectional view showing a structure of a display substrate in accordance with embodiments of the present disclosure.

In order to illustrate the objects, technical solutions and advantages of the present disclosure more clearly, the display substrate, the method for manufacturing the display substrate, the display panel and the display device in accordance with the embodiments of the present disclosure will be described in detail below with reference to the accompanying drawings.

The thicknesses and shapes of film layers of the display substrate shown in the drawings are not necessarily drawn to scale, but are intended to show the present disclosure by way of examples.

Unless otherwise defined, technical terms or scientific terms used in the present disclosure are intended to be understood as having the ordinary meaning for those skilled in the art. The words "first", "second" and the like used in the present disclosure are not intended to indicate any order, number, or priority, but to distinguish different components. The word "a" or "an" does not exclude a plurality. The word "comprising" or "including" and the like mean that the element or item before the word is intended to encompass the element, the item and the like recited after the word, and not exclude other element or item. The word "connect" or "couple" and the like are not limited to physical or mechanical connections, but may include electrical connections, including direct or indirect connections. The words "upper", "lower", "left", "right", "top", "bottom" and the like are only used to indicate relative positional relationships. When the absolute position of the described object changes, their relative positional relationship may also change accordingly. When an element, such as a layer, a film, a region or a substrate, is referred to as being "on" or "under" another element, the element can be "on" or "under" another element "directly". Alternatively, there may be intermediate elements between them.

The inventors of the present application have recognized that upon manufacturing an organic light emitting diode display panel, if the cathode layer is formed by sputtering ITO, the organic functional layer may tend to be destroyed and the luminous efficiency of the organic light emitting diode display panel is thereby decreased; otherwise, if the cathode layer is formed by evaporating the partially transparent metal material, the resultant cathode layer may typically have large resistance such that large IR drop will be generated in display to finally reduce quality of picture in the display panel.

To this end, embodiments of the present disclosure provide a display substrate. As shown in FIG. 1, the display substrate includes a base substrate 10. A plurality of pixel areas A are arranged on the base substrate 10. The pixel areas A each include a first electrode layer (for example an anode layer) 11, an organic functional layer 12 and a second electrode layer (for example a cathode layer) 13 (as an example, the second electrode layer 13 may formed as an entire layer across the substrate) stacked in sequence on the base substrate 10. The display substrate further includes a third electrode layer (or called as an assistant electrode) 14 located on a side of the second electrode layer 13 facing away from the base substrate 10 and electrically connected to the second electrode layer 13. In some embodiments, the third electrode layer 14 may be a transparent electrode.

The display substrate provided by the embodiments of the present disclosure includes a base substrate having a plurality of pixel areas, which each include a first electrode layer, an organic functional layer and a second electrode layer stacked in sequence on the base substrate, and a third electrode layer located on a side of the second electrode layer facing away from the base substrate and electrically connected to the second electrode layer. In the present disclosure, the third electrode layer electrically connected to (for example in parallel contact with) the second electrode layer is provided and the third electrode layer and the second electrode layer connected to each other have an equivalent resistance less than the resistance of the second electrode layer itself, thus it may reduce the IR drop across the second electrode layer effectively so that it can achieve high quality of picture. And the third electrode layer is a transparent electrode, thus it cannot affect the light emitted from the second electrode layer.

In some embodiments, when the second electrode layer is electrified, the electrical current is also conducted to the third electrode layer. The third electrode layer and the second electrode layer are arranged in parallel to form a combined part which has a resistance less than the resistance of the second electrode layer itself. In comparison with the display substrate without the third electrode layer, the IR drop across the second electrode layer on the display substrate provided by the present disclosure can be reduced effectively, thus, electrical signals will have relatively small loss in the second electrode layer and in the third electrode layer, so as to achieve high quality of picture.

In some embodiments, the third electrode layer may be a transparent electrode layer made from metal oxide and the transparent electrode layer may be prepared by magnetron sputtering. High temperature will occur in magnetron sputtering, which may damage the second electrode layer and affect injection of charge carriers into the second electrode layer disadvantageously. Thus, in some embodiments, as shown in FIG. 1, the display substrate may further include a transparent dielectric layer 15 between the second electrode layer 13 and the third electrode layer 14. In some embodiments, an orthographic projection of the transparent dielectric layer 15 on the base substrate 10 may cover orthographic projections of the pixel areas A on the base substrate 10. In some embodiments, the transparent dielectric layer 15 may include a plurality of dielectric areas 121. The plurality of dielectric areas 121 may be in one-to-one correspondence with the plurality of pixel areas A. For example, an orthographic projection of each of the plurality of dielectric areas 121 on the base substrate 10 covers an orthographic projection of one of the pixel areas A on the base substrate 10, and the third electrode layer 14 is electrically conducted to the second electrode layer 13 through gaps between adjacent dielectric areas 121. In some embodiments, the transparent dielectric layer 15 only corresponds to the pixel areas A. In non-pixel areas (areas between pixel areas A), there are no transparent dielectric layers 15. The second electrode layer 13 is electrically connected to the third electrode layer 14 at positions in the non-pixel areas, thus, in the present disclosure, portions of the second electrode layer in the pixel areas A may not be destroyed, and contact and electrical connection of the third electrode layer 14 with the second electrode layer 13 may be achieved in the non-pixel areas such that the IR drop across the second electrode layer 13 can be reduced without destroying the second electrode layer 13. In this way, high quality of picture may be achieved.

In some embodiments, in the above display substrate provided by embodiments of the present disclosure, the transparent dielectric layer may be made from organic insulating materials or inorganic insulating materials. In particular, a dielectric layer formed from any materials that are transparent and insulative belongs to the scope of the present disclosure.

Figure 2:
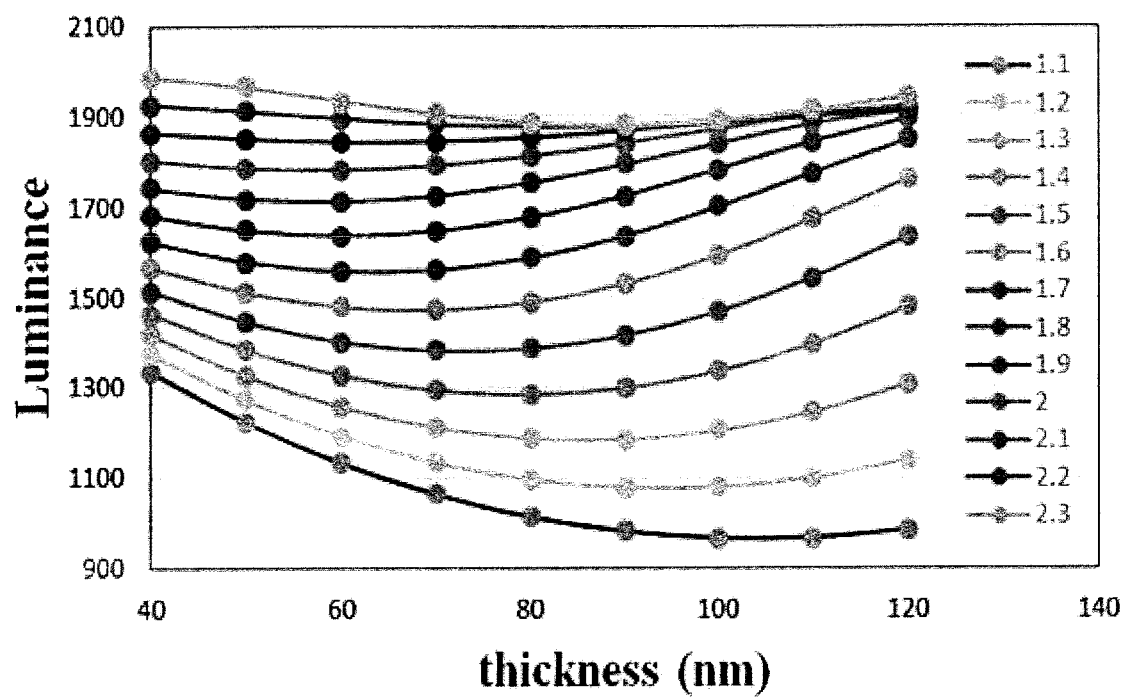
FIG. 2 is a schematic graph showing a relationship between transparent dielectric layers with different thicknesses and different refractive indices and the brightness of the light exiting from a corresponding second electrode layer in accordance with embodiments of the present disclosure.

In some embodiments, as shown in FIG. 2, the brightness of the light exiting from the second electrode layer 13 may be adjusted by changing refractive index or thickness of the transparent dielectric layer 15. FIG. 2 is a graph showing the correspondence between brightness of the light exiting from the second electrode layer 13 and different thicknesses and different refractive indices of the transparent dielectric layer 15. It can be seen from the graph that change of the thickness and refractive index of the transparent dielectric layer 15 may affect the brightness of devices. Thus, reasonable selection of materials and adjustments of thickness may improve luminous characteristics of devices. Specifically, a horizontal coordinate in FIG. 2 represents thickness of the transparent dielectric layer with a unit of nanometers. A vertical coordinate in FIG. 2 represents Luminance of the light exiting from the second electrode layer. The values of 1.1 to 2.3 on the right side in FIG. 2 represent different refractive indices of the transparent dielectric layer and the curves corresponding to those refractive indices are arranged from bottom to top. For one same refractive index, different thicknesses of the transparent dielectric layer correspond to different luminance values of the light exiting from the second electrode layer. For one same thickness, different refractive indices of the transparent dielectric layer also correspond to different luminance values of the light exiting from the second electrode layer. Therefore, the luminance of the light exiting from the second electrode layer may be adjusted by changing the thickness or refractive index of the transparent dielectric layer.

In the above display substrate provided by embodiments of the present disclosure, the transparent dielectric layer has a refractive index of 1.0 to 2.5. However, the embodiments of the present disclosure are not limited to this.

In the above display substrate provided by embodiments of the present disclosure, the transparent dielectric layer has a thickness of 30 nanometers to 300 nanometers. However, the embodiments of the present disclosure are not limited to this. In some embodiments, the thickness of the transparent dielectric layer may be wider than the thickness provided in the embodiments of the present disclosure. Specifically, the thickness of the transparent dielectric layer which can be selected as required in process also falls within the scope of the present disclosure.

In some embodiments, in the above display substrate provided by the embodiments of the present disclosure, the second electrode layer is a partially transparent metal electrode layer. In this way, the second electrode layer may be formed by evaporation without destroying the performance of organic functional layer. Material of the third electrode layer may include an indium tin oxide, an indium zinc oxide or both of them. Certainly, material of the third electrode layer may further include other transparent electrically conductive materials, which belong to the scope of the present disclosure.

In some embodiments, the organic functional layer 12 may include any layer structures for achieving organic light emitting function, such as a light emitting layer, an electron transport layer, an electron injection layer, a hole transport layer or a hole injection layer.

Figure 3:
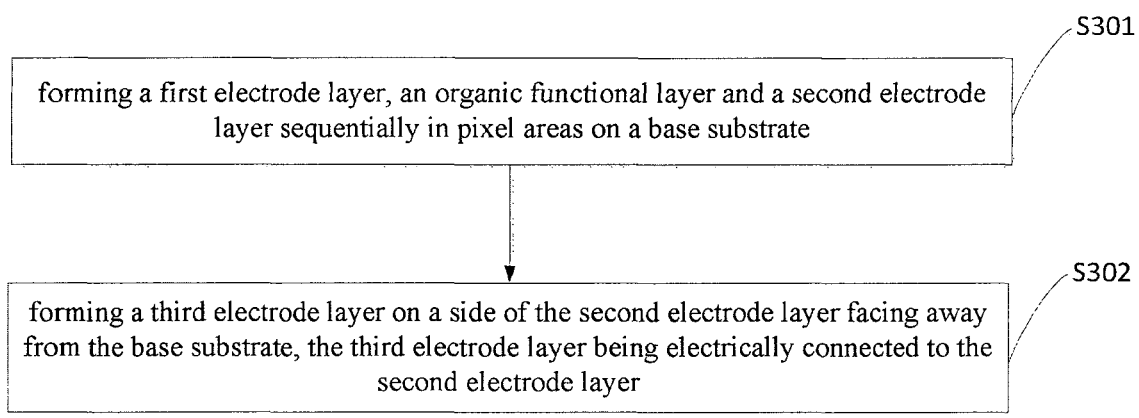
FIG. 3 schematically illustrates a first flow chart of a method for manufacturing a display substrate in accordance with embodiments of the present disclosure.

Embodiments of the present disclosure also provide a method for manufacturing a display substrate. As shown in FIG. 3, the method includes:

Step S301: forming a first electrode layer, an organic functional layer and a second electrode layer sequentially in pixel areas on a base substrate; and Step S302: forming a third electrode layer on a side of the second electrode layer facing away from the base substrate, the third electrode layer being electrically connected to the second electrode layer. The third electrode layer may be a transparent electrode.

In the method for manufacturing the display substrate provided by the embodiments of the present disclosure, by providing a third electrode layer 14 electrically connected to (for example in parallel contact with) the second electrode layer 13, the third electrode layer and the second electrode layer connected in parallel to each other have an equivalent resistance less than the resistance of the second electrode layer 13 itself, thus it may reduce the IR drop across the second electrode layer 13 effectively so that it can achieve high quality of picture. And the third electrode layer 14 is a transparent electrode, thus it will not affect the light emitted from the second electrode layer 13.

Figure 4:
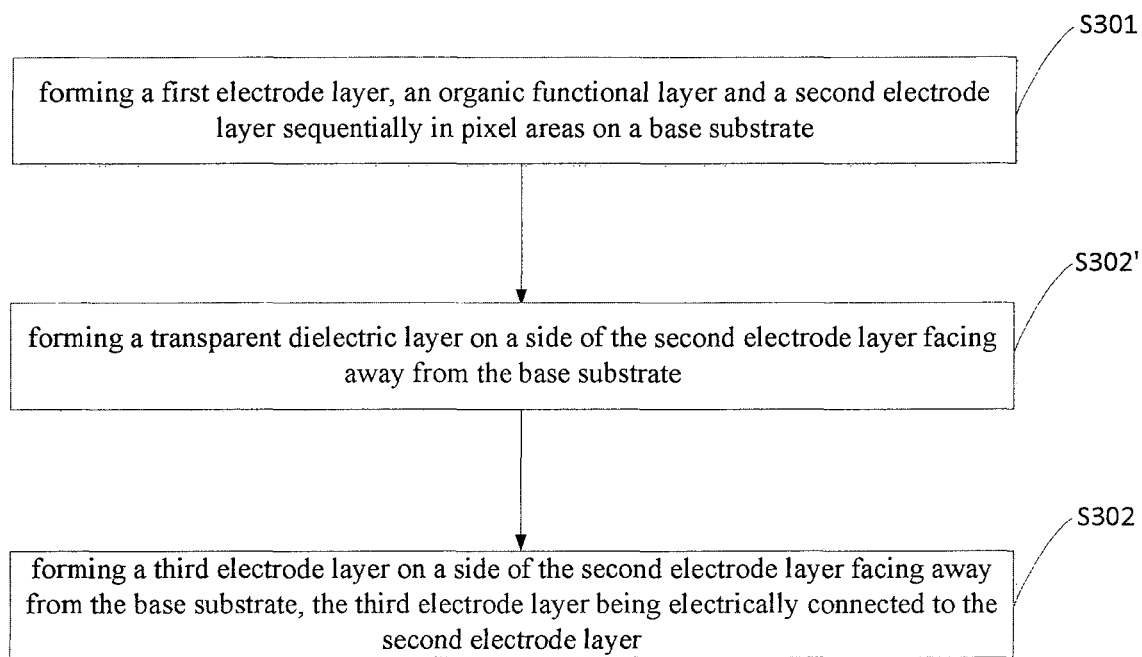
FIG. 4 schematically illustrates a second flow chart of a method for manufacturing a display substrate in accordance with embodiments of the present disclosure.

In some embodiments, in the above method for manufacturing the display substrate provided by the embodiments of the present disclosure, as shown in FIG. 4, after forming the second electrode layer and before forming the third electrode layer, the method further includes:

Step S302': forming a transparent dielectric layer on a side of the second electrode layer facing away from the base substrate.

In some embodiments, the above step S302' may include:

patterning the transparent dielectric layer to form a plurality of dielectric areas, an orthographic projection of each of the plurality of dielectric areas on the base substrate covering an orthographic projection of one of the pixel areas on the base substrate.

In the embodiments, the third electrode layer is electrically conducted to the second electrode layer through gaps between adjacent dielectric areas.

In some embodiments, the third electrode layer may be a transparent electrode layer made from metal oxide and the transparent electrode layer may be prepared by magnetron sputtering. High temperature will occur in magnetron sputtering, which may damage the second electrode layer and affect injection of charge carriers into the second electrode layer disadvantageously. Thus, in the above method for manufacturing the display substrate provided by some embodiments of the present disclosure, respective parts of the transparent dielectric layer are only formed in one-to-one correspondence with the pixel areas and between the second electrode layer and the third electrode layer. The second electrode layer will not be destroyed upon preparing the third electrode layer by magnetron sputtering and the third electrode layer may be electrically conducted to the second electrode layer at positions in the non-pixel areas such that the IR drop across the second electrode layer can be reduced without affecting injection of charge carriers into the second electrode layer disadvantageously. In this way, high quality of picture may be achieved.

The method for manufacturing the display substrate shown in FIG. 1 will be explained in detail below with reference to exemplary embodiments.

Figure 5A:
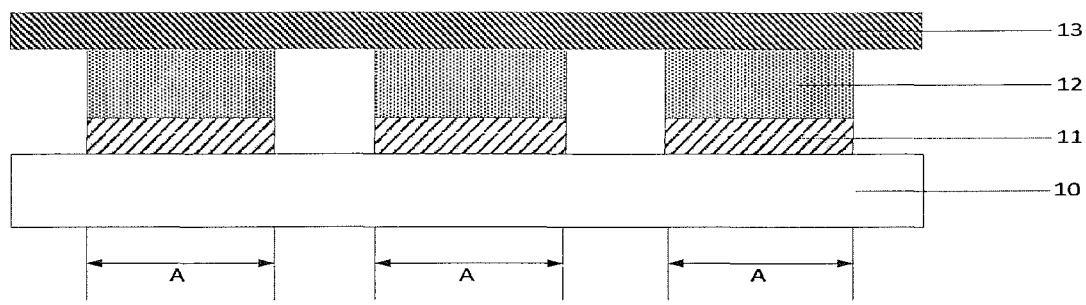
FIG. 5A and FIG. 5B show schematically cross sectional views of structures formed after some steps of the method are performed in accordance with embodiments of the present disclosure.

(1) The first electrode layer 11, the organic functional layer 12 and the second electrode layer 13 are formed in sequence in the pixel areas A on the base substrate 10, as illustrated in FIG. 5A; in particular, the first electrode layer 11, the organic functional layer 12 and the second electrode layer 13 are formed by evaporation.

Figure 5B:
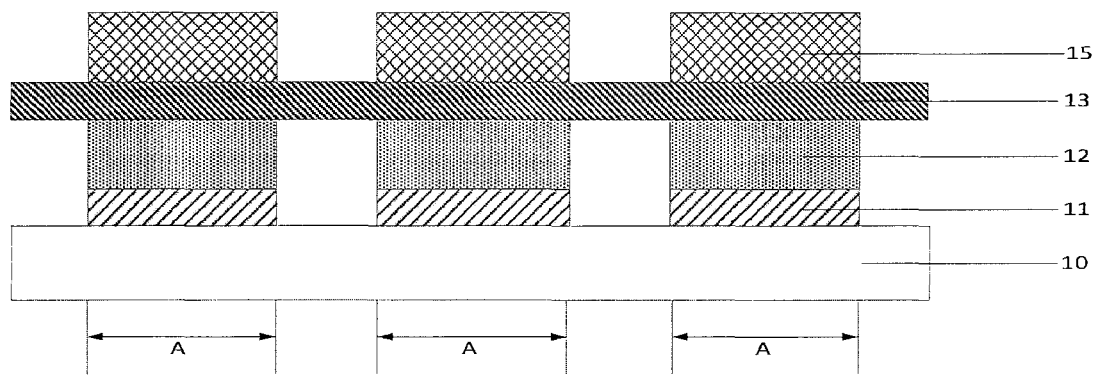

(2) Respective parts of the transparent dielectric layer 15 are formed, in one-to-one correspondence with the pixel areas A, on the base substrate 10 formed with the second electrode layer 13, as shown in FIG. 5B; in particular, an entire transparent dielectric layer 15 may be formed above the second electrode layer 13. The transparent dielectric layer 15 is patterned (for example by lithographic process) to maintain parts of the transparent dielectric layer 15 in the pixel areas A and remove other parts of the transparent dielectric layer 15 in the non-pixel areas. Or, the patterned transparent dielectric layer 15 may be formed directly only in the pixel areas A by evaporation using Fine Metal Mask (FMM). In this way, the parts of the transparent dielectric layer 15 in the pixel areas A may prevent the second electrode layer from being destroyed. Electrical conduction between the subsequently produced third electrode layer and the second electrode layer 13 may be achieved within the non-pixel areas.

(3) The transparent third electrode layer 14 is formed on the base substrate 10 formed with the transparent dielectric layer 15 by magnetron sputtering such that it is electrically conducted to the second electrode layer 13, as shown in FIG. 1.

The display substrate provided by the embodiments of the present disclosure shown in FIG. 1 may be obtained after the above steps (1) to (3) in the above embodiments are performed.

Embodiments of the present disclosure also provide a display panel including any one of the display substrate provided by the above embodiments of the present disclosure. Principles of the display panel solving the problem are similar to the above display substrate. Thus, the implementation of the display panel may refer to the above embodiments of the display substrate. The repeated details will be omitted here.

Embodiments of the present disclosure also provide a display device including the display panel provided by the above embodiments of the present disclosure. Principles of the display device solving the problem are similar to the above display substrate. Thus, the implementation of the display device may refer to the above embodiments of the display substrate. The repeated details will be omitted here.

In some embodiments, the above display device provided by the embodiments of the present disclosure may be a full screen display device, or may be a flexible display device, and so on. However, embodiments of the present disclosure are not limited to those.

Figure 6:
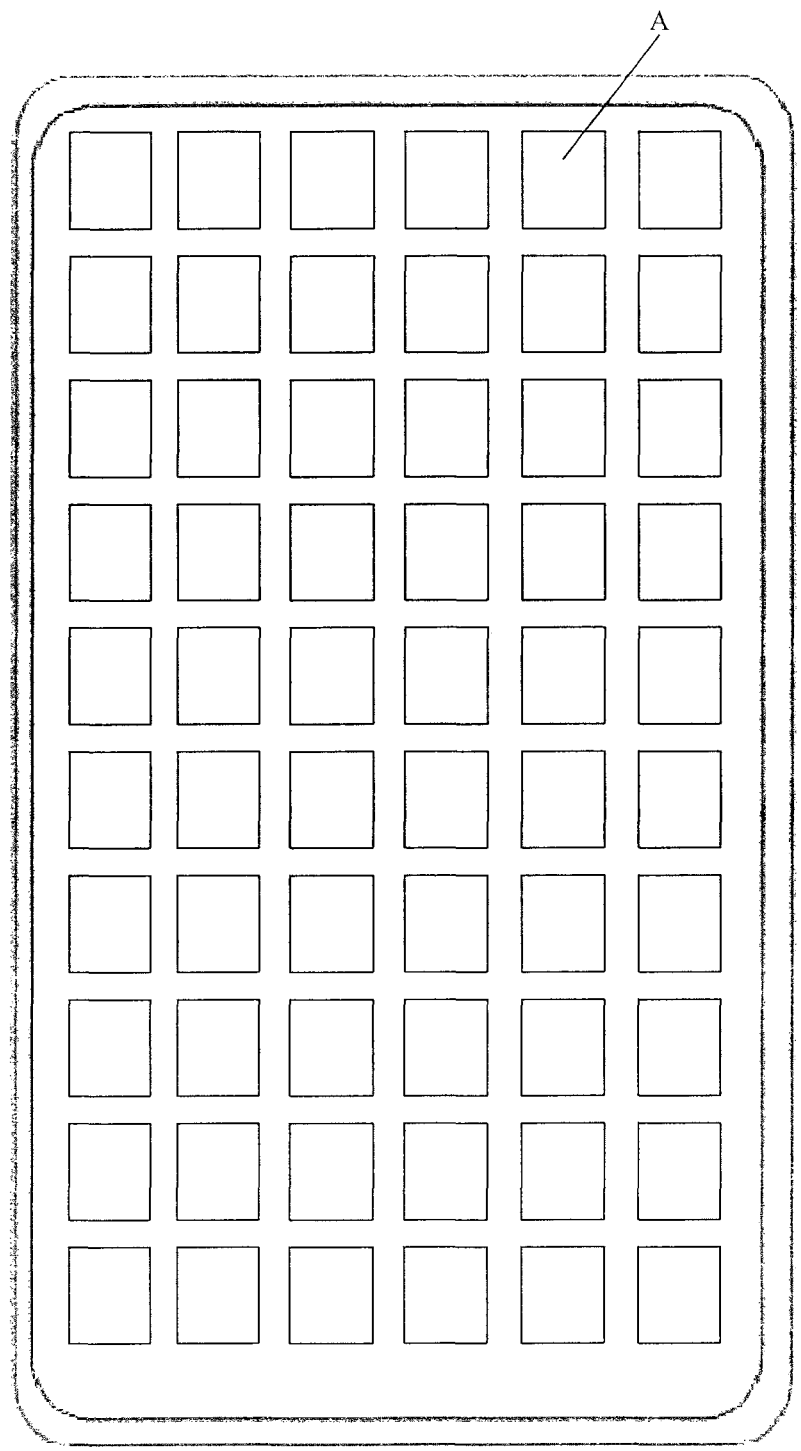
FIG. 6 is a schematic top view showing a display device in accordance with embodiments of the present disclosure.

In some embodiments, the above display device provided by the embodiments of the present disclosure may be a cell phone with a full screen, as shown in FIG. 6. FIG. 6 shows the display device includes a plurality of pixel areas A. Certainly, the above display device provided by the embodiments of the present disclosure may be any products or components having a display function, such as a tablet computer, a television, a display apparatus, a notebook computer, a digital photo frame or a navigator. The skilled person in the art should recognize the display device may have other necessary parts. The details will be omitted here. The present disclosure is not limited to this.

The embodiments of the present disclosure provide the display substrate and the method for manufacturing the same, the display panel and the display device. The display substrate includes: a base substrate having a plurality of pixel areas, at least one (or each) of the plurality of pixel areas including a first electrode layer, an organic functional layer and a second electrode layer stacked in sequence on the base substrate; and a third electrode layer on a side of the second electrode layer facing away from the base substrate and electrically connected to the second electrode layer. The third electrode layer is a transparent electrode. In the present disclosure, the third electrode layer electrically connected to the second electrode layer is provided, and the third electrode layer and the second electrode layer connected in parallel to each other have an equivalent resistance less than the resistance of the second electrode layer itself, thus it may reduce the IR drop across the second electrode layer effectively so that it can achieve high quality of picture. And the third electrode layer is a transparent electrode, thus it will not affect the light exiting from the second electrode layer.

Obviously, the skilled person in the art can make all of kinds of modifications and variations without departing from the spirit and scope of the present disclosure. In this way, as long as these modifications and variations fall within the scope of claims in the present disclosure and equivalent thereof, the present disclosure will include these modifications and variations.

What is claimed is:

1. A display substrate comprising:
   a base substrate on which a plurality of pixel areas are arranged, at least one of the plurality of pixel areas comprising a first electrode layer, an organic functional layer and a second electrode layer stacked in sequence on the base substrate; and
   a third electrode layer on a side of the second electrode layer facing away from the base substrate;
   wherein the third electrode layer is electrically connected to the second electrode layer, and
   wherein the material of the third electrode layer comprises an indium tin oxide, an indium zinc oxide or both of them.

2. The display substrate according to claim 1, further comprising a transparent dielectric layer between the second electrode layer and the third electrode layer.

3. The display substrate according to claim 1, wherein the third electrode layer is a transparent electrode layer and the second electrode layer is a partially transparent metal electrode layer.

4. A display device comprising the display substrate according to claim 1.

5. The display substrate according to claim 2, wherein an orthographic projection of the transparent dielectric layer on the base substrate covers orthographic projections of the plurality of pixel areas on the base substrate.

6. The display substrate according to claim 2, wherein the transparent dielectric layer is made from an organic insulating material or an inorganic insulating material.

7. The display substrate according to claim 2, wherein the transparent dielectric layer has a refractive index of 1.0 to 2.5.

8. The display substrate according to claim 2, wherein the transparent dielectric layer has a thickness of 30 nanometers to 300 nanometers.

9. The display substrate according to claim 5, wherein the transparent dielectric layer comprises a plurality of dielectric areas, and an orthographic projection of each of the plurality of dielectric areas on the base substrate covers an orthographic projection of one of the plurality of pixel areas on the base substrate and the third electrode layer is electrically conducted to the second electrode layer through gaps between adjacent ones of the plurality of dielectric areas.

10. The display device according to claim 4, wherein the display substrate further comprises a transparent dielectric layer between the second electrode layer and the third electrode layer.

11. The display device according to claim 4, wherein the third electrode layer is a transparent electrode layer and the second electrode layer is a partially transparent metal electrode layer.

12. The display device according to claim 10, wherein an orthographic projection of the transparent dielectric layer on the base substrate covers orthographic projections of the plurality of pixel areas on the base substrate.

13. The display device according to claim 12, wherein the transparent dielectric layer comprises a plurality of dielectric areas, and an orthographic projection of each of the plurality of dielectric areas on the base substrate covers an orthographic projection of one of the plurality of pixel areas on the base substrate and the third electrode layer is electrically conducted to the second electrode layer through gaps between adjacent ones of the plurality of dielectric areas.

14. The display device according to claim 11, wherein the transparent dielectric layer is made from an organic insulating material or an inorganic insulating material.

15. The display device according to claim 11, wherein the transparent dielectric layer has a refractive index of 1.0 to 2.5.

16. The display device according to claim 11, wherein the transparent dielectric layer has a thickness of 30 nanometers to 300 nanometers.

17. A method for manufacturing a display substrate, the method comprising:
    forming a first electrode layer, an organic functional layer and a second electrode layer sequentially in pixel areas on a base substrate;
    forming a third electrode layer on a side of the second electrode layer facing away from the base substrate, the third electrode layer being electrically connected to the second electrode layer,
    wherein the material of the third electrode layer comprises an indium tin oxide, an indium zinc oxide or both of them.

18. The method according to claim 17, wherein after forming the second electrode layer and before forming the third electrode layer, the method further comprises:
    forming a transparent dielectric layer on a side of the second electrode layer facing away from the base substrate.

19. The method according to claim 18, wherein the forming a transparent dielectric layer on a side of the second electrode layer facing away from the base substrate further comprises:
    patterning the transparent dielectric layer to form a plurality of dielectric areas, an orthographic projection of each of the plurality of dielectric areas on the base substrate covering an orthographic projection of one of the plurality of pixel areas on the base substrate,
    wherein the third electrode layer is electrically conducted to the second electrode layer through gaps between adjacent ones of the plurality of dielectric areas.

* * * * *